United States Patent [19]

Garbacz

[11] 4,422,057
[45] Dec. 20, 1983

[54] SURFACE WAVE FILTER WITH REDUCED SUBSTRATE SIZE

[75] Inventor: Michael Garbacz, Norridge, Ill.

[73] Assignee: Zenith Radio Corporation, Glenview, Ill.

[21] Appl. No.: 370,705

[22] Filed: Apr. 22, 1982

[51] Int. Cl.³ .................. H03H 9/25; H03H 9/64; H03H 9/72
[52] U.S. Cl. ................................ 333/194; 333/153; 333/196
[58] Field of Search ................. 333/150–155, 333/193–196; 310/313 R, 313 A, 313 B, 313 C, 313 D; 29/25.35

[56] References Cited
U.S. PATENT DOCUMENTS 3,898,592  8/1975  Solie ............................. 333/195
4,155,056  5/1979  Cross et al. .................... 333/195
4,379,274  4/1983  Hansen ........................ 333/195 X Primary Examiner—Marvin L. Nussbaum

[57] ABSTRACT

An acoustic surface wave multiplexing filter is described having two signal processing paths, one for each of two possible input signals. Each processing path includes an input transducer, a multistrip coupler, and an output transducer. To save substrate area, the multistrip couplers are formed on the substrate in a position of side-by-side overlap with each other.

12 Claims, 2 Drawing Figures

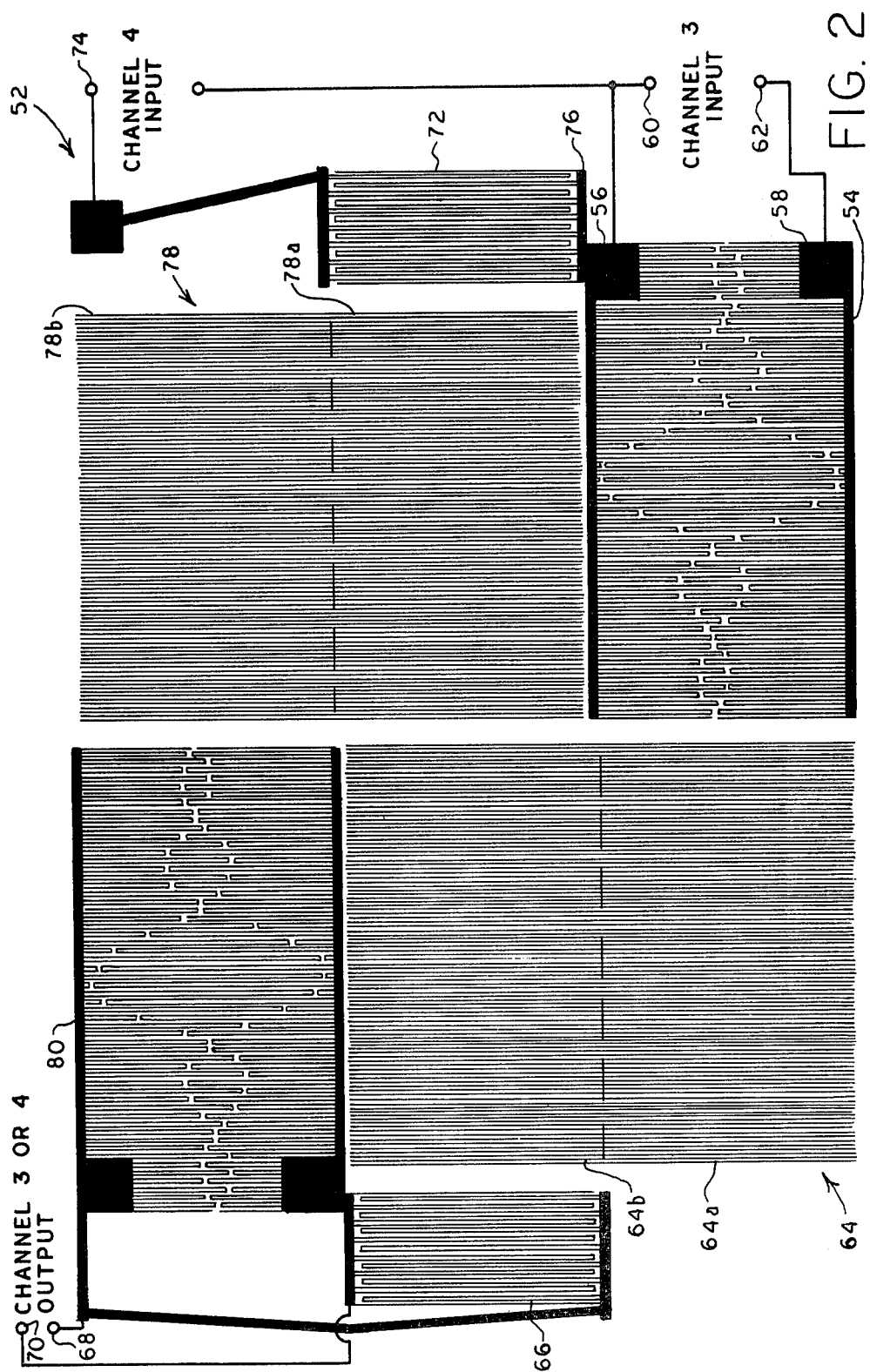

SURFACE WAVE FILTER WITH REDUCED SUBSTRATE SIZE

BACKGROUND OF THE INVENTION

This invention is generally directed to improvements in acoustic surface wave devices. It is particularly directed to an acoustic surface wave filter for multiplexing a pair of signal inputs to develop a filtered signal output.

Exemplary surface wave filters of the type considered herein are designed to receive and filter one of two possible input signals. For example, a filter may have one input port adapted to receive a signal corresponding to channel 3 of the television spectrum, another input port adapted to receive a signal corresponding to channel 4 of the television spectrum, and a single output port. Thus, the device is adapted to receive either of two input signals and to develop therefrom an output signal from which spurious components have been removed by filtering.

Design objectives of such filters include minimizing the size of the filter's substrate, eliminating the effects of acoustic reflections from substrate edges, and minimizing the filter's insertion loss. To some extent, these objectives are met in prior designs, such as that described in U.S. application, Ser. No. 290,649, filed Aug. 7, 1981, and now U.S. Pat. No. 4,379,274, the pertinent teachings of which are included herein by reference. Nevertheless, fabrication costs require further reduction in substrate size without sacrificing performance characteristics.

Accordingly, it is a general object of the invention to provide an improved multiplexing filter constructed as an acoustic surface wave device.

It is a more specific object of the invention to provide such a filter which employs a relatively small substrate without compromising filter performance.

BRIEF DESCRIPTION OF THE FIGURES

The objects stated above and other objects of the invention are set forth more particularly in the following detailed description and in the accompanying drawings, of which:

FIG. 2 depicts an alternate acoustic surface wave multiplexing filter according to the invention.

DESCRIPTION OF THE PREFERRED EMBODIMENT

Figure 1:
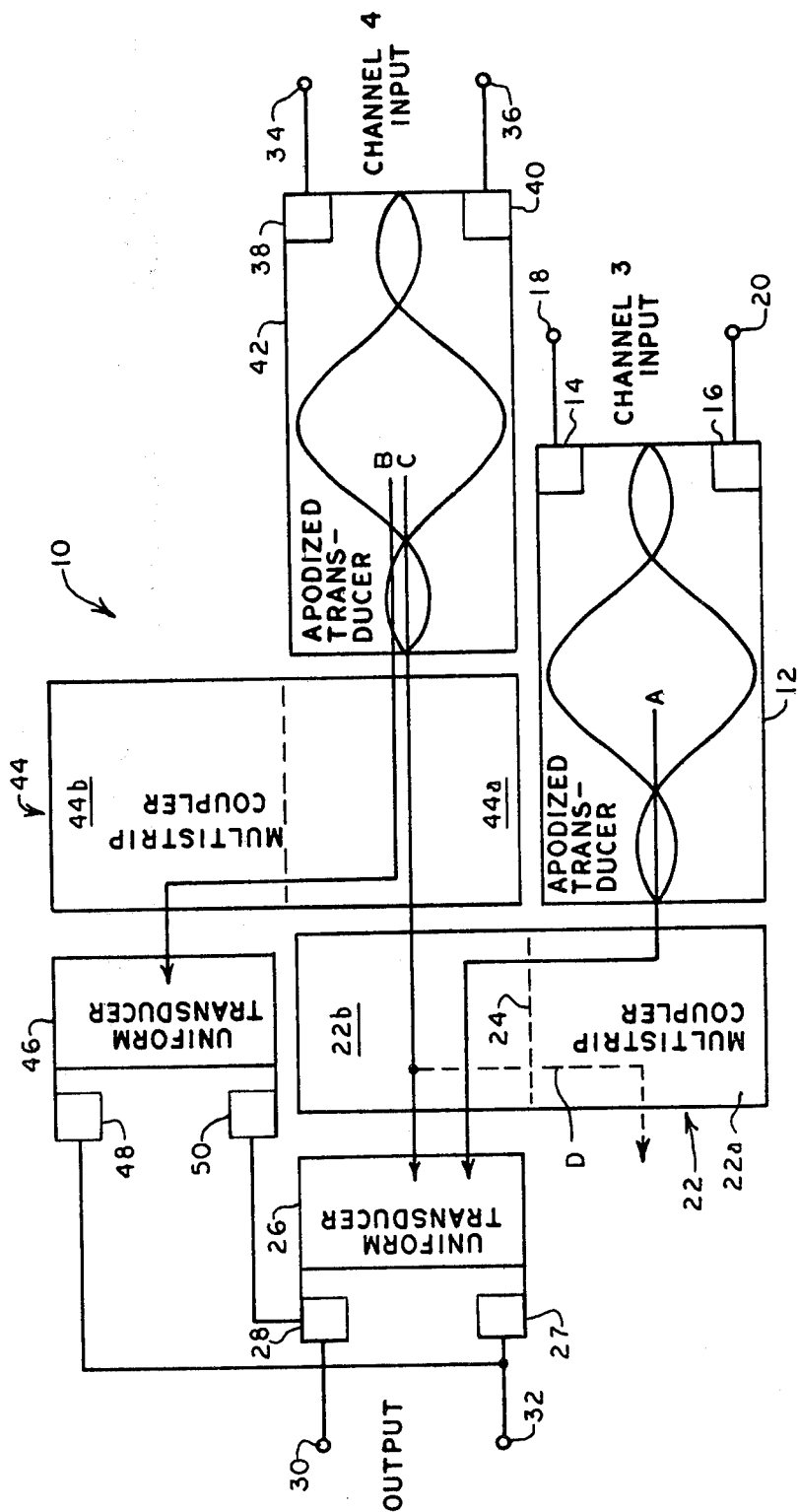
FIG. 1 illustrates an acoustic surface wave multiplexing filter according to the invention.

Referring to FIG. 1, an acoustic surface wave filter 10 is depicted whose various components are arranged on a piezoelectric substrate (not shown) so as to minimize substrate area without degrading the performance of the filter. As shown, the filter 10 includes a first input transducer 12 for receiving a first signal input via pads 14 and 16 and input terminals 18 and 20. The first signal input may correspond to channel 3 in the television spectrum.

As indicated in the drawings, the transducer 12 is preferably an apodized transducer, i.e., one which has overlapping regions of transducer fingers which are lengthweighted along the transducer axis so as to provide a selected bandpass.

In response to the first electrical input signal, the transducer 12 launches acoustic surface waves in the direction of a path A for receipt by a multistrip coupler 22. As with conventional multistrip couplers, the coupler 22 has a lower track 22a and an upper track 22b, the division between tracks being identified by a dashed line 24. The energy associated with surface waves received by the lower track 22a is shifted to the upper track 22b, from which additional surface waves are launched in the direction indicated by the continuation of path A.

Located adjacent the upper track of the coupler 22 is an output transducer 26 which may be either a uniform transducer or an apodized transducer. For this embodiment, the transducer 26 is preferably a uniform transducer which receives the surface waves launched from the upper track of the coupler 22 and develops a corresponding electrical output signal at pads 27 and 28 and output terminals 30 and 32. Thus, an input signal applied to terminals 18 and 20 is converted to a filtered output signal at terminals 30 and 32 by the operation of the apodized transducer 12, the multistrip coupler 22, and the uniform transducer 26. The acoustic surface waves travel primarily along the desired path A.

An electrical input signal which may correspond to channel 4 of the television spectrum may be applied via input terminals 34 and 36 and pads 38 and 40 to a second apodized input transducer 42 which also has a selected bandpass. In response to its received input signal, the transducer 42 launches acoustic surface waves which are intended to follow a primary path B.

The surface waves launched by the transducer 42 are received by the lower track 44a of another multistrip coupler 44. Most of the energy associated with these received surface waves is transferred to the coupler's upper track 44b, from which additional surface waves are launched in the direction indicated by the continuation of path B.

Located adjacent the upper track 44b is a second uniform output transducer 46 which receives the launched surface waves and converts them to a corresponding electrical output signal at pads 48 and 50. These pads are connected in parallel with pads 27 and 28, respectively, so that the channel 4 filtered output signal appears across output terminals 30 and 32.

Two important aspects of the filter 10 are its architecture (the layout of the various components) and the manner in which the multistrip couplers transfer the energy associated with their received surfaces waves. The architecture is discussed first.

To reduce the substrate area required by the filter 10, the multistrip couplers are arranged on the substrate in a position of side-by-side overlap as shown. That is, the upper track 22b of the coupler 22 is adjacent the lower track 44a of the coupler 44, and the lengthwise dimensions of both couplers extend in parallel directions. As is clear from the drawings, the term "overlap" is not used in the sense of one coupler overlying the other coupler, but in the sense that one coupler is adjacent and diagonally offset from the other coupler.

The output end of the input transducer 12 is located directly beneath the lower track of the coupler 44 and immediately adjacent the lower track of the coupler 22. The output transducer 26 is located on the opposite side of the coupler 22 and adjacent to its upper track 22b.

The input transducer 42 is positioned such that it is in substantially straight horizontal alignment with the output transducer 26 and separated therefrom by the overlapping portions of multistrip couplers 22 and 44. The area above the coupler 22 and adjacent to the coupler 44 contains the output transducer 46.

The arrangement described permits the components of the filter to be formed on a substrate of reduced size, due primarily to the overlap between the couplers 22 and 44. Such overlap has previously been thought to be undesirable for the reasons discussed below, but the design of the multistrip couplers alleviates those problems.

As explained previously, the electrical signals applied to the input transducers 12 and 42 result in acoustic surface waves which travel along paths A and B to their respective output transducers. The surface waves launched by the transducer 42 may, however, take an undesired path C. If the energy associated with acoustic surface waves received by the coupler 44 is not transferred entirely from the lower track 44a to the upper track 44b, some of that energy is translated into surface waves directed along the path C toward the upper track of the multistrip coupler 22. A portion of the path C energy received by the upper track 22b is shifted downwardly to the lower track 22a and thence to the substrate as indicated by the dashed line D. However, some of the energy can pass through the upper track 22b directly to the output transducer 26 and cause distortion in the output signal. Thus, when an electrical input signal is applied to the transducer 42, two output signals may be developed across terminals 30 and 32. One output signal results from the propagation of energy along the desired path B and another output signal may result from the propagation of energy along the path C. The latter path is, of course, undesired since it results in distortion of the channel 4 frequency response.

To overcome the foregoing problem, both multistrip couplers are configured to maximize the transfer of acoustic energy between their upper and lower tracks. Whereas couplers conventionally may provide a 90 percent transfer of energy between their tracks, the couplers 22 and 24 are configured to increase their transfer of energy to about 98 percent. The results obtained by maximizing the transfer of energy between the lower and upper tracks may be explained by the following example.

When an electrical signal is applied to the input terminals 34 and 36 of the transducer 42, an acoustic wave is generated which propagates over the lower track 44a of coupler 44 via the desired path B and the undesired path C. The energy which propagates along the path B is eventually received by the transducer 46 where the received energy is transformed back to an electrical output signal. Because the coupler 44 is designed for maximum transfer of energy between its tracks, only about 2 percent of the acoustic energy which it receives from the transducer 42 is transmitted to the coupler 22 via the path C. Because the coupler 22 is likewise designed for maximum transfer of energy between its tracks, only about 2% of the energy which enters this coupler via the path C continues into transducer 26 via the continuation of path C. The remaining part of energy entering coupler 22 is shifted to its lower track 22a as indicated by the path D. The energy in path D is thus coupled to an area of the substrate having no transducers and, in that way, rendered harmless. By taking advantage of the maximum transfer of energy between tracks in the multistrip couplers and the particular layout of the structures on the substrate, the undesired signal transmitted from the transducer 42 to the transducer 26 via the path C is minimized.

In addition to exhibiting maximum energy transfer from one track to another track, the multistrip couplers are preferably designed such that the third harmonic of the passbands of their associated filter channels will be suppressed. The transducer 42, the multistrip coupler 44 and the transducer 46 constitute one filter channel. Likewise, the transducer 12, the multistrip coupler 22 and the transducer 26 constitute another filter channel. In addition to passing frequencies in their selected passbands, each filter channel will ordinarily have spurious passbands at odd harmonics of their fundamental passbands. In many applications, the third harmonic spurious passbands cause most problems, wherefore it is desirable to suppress them. Hence, the multistrip couplers are preferably designed to suppress energy transmission between their tracks in a frequency range around the second harmonic of the multistrip couplers resonance frequency $f_o$. The multistrip couplers resonance frequency is defined as the frequency for which the distance between the center lines of adjacent multistrip coupler lines is equal to one-half of the wave length of the acoustic surface waves. By designing each multistrip coupler such that two times its resonance frequency coincides with or is slightly below three times the center frequency of the desired passband of its associated filter channel, the multistrip coupler effectively suppresses the third harmonic spurious passband of its filter channel.

With the above criteria in mind, a design example is provided for the case where the channel 3 input has a frequency of 63 megahertz and the channel 4 input has a frequency of 69 megahertz. The number of lines $N_T$ in each multistrip coupler is selected as described in "Theory and Design of the Surface Acoustic Wave Multistrip Coupler" by Marshall et al; IEEE Transactions on Microwave Theory and Techniques, Vol. MTT-21, No. 4, April 1973. Briefly, $N_T$ is selected as set forth in Equation (1) below:

Equation (1):

$$N_T = \frac{\pi}{FK^2} \cdot \frac{(\theta/2)}{\sin^2(\theta/2)}$$

In Equation 1, F and K are material constants which give a typical value of 0.043 for $FK^2$, and $\theta$ is given by Equation 2.

Equation (2):

$$\theta = \frac{2\pi f a d}{v}$$

The phase elapse angle, $\theta$ may be calculated by selecting $f_o$ (96 megahertz for the coupler 44) and solving for d where d equals v-2fo, v being the known surface wave velocity for the material, 3445 meters per second, for example. The active fraction of periodic repeat distance (a) may be selected to be 0.85.

Using the resulting value for $\theta$ and solving for $N_T$ as shown in Equation (1) gives and $N_T$ of 103 lines for the coupler 22 and 107 lines for the coupler 44. The distance between adjacent lines of the coupler 44 may be 0.705 mils. Using these values and conventional design techniques for the input and output transducers, output signals are developed with minimal distortion and minimum propagation along path C.

It is possible to vary the layout of the filter 10 and yet maintain a small substrate by using the principle of overlapping multistrip couplers. One such variation is shown in FIG. 2 to which reference is now made.

In FIG. 2, an acoustic surface wave filter 52 is shown in detail to illustrate the lines or strips multistrip couplers and each has an input transducer (72 in FIG. 2) which is in substantially straight horizontal alignment with an output transducer (66 in FIG. 2) which is separated from the input transducer by overlapping portions of the multistrip couplers. As with the filter 10, the couplers 64 and 78 are designed to maximize the transfer of energy from their lower tracks to their upper tracks and to suppress the third harmonic of an input signal. Thus, the number of lines and the distance between lines in the couplers 64 and 78 may be the same as previously described for the couplers 22 and 44. The dimensions of the coupler 64 may be 80 by 96 mils, and the dimensions of the coupler 78 may be 75 by 96 mils.

In the embodiment of FIG. 2, the space made available by overlapping the multistrip couplers is used efficiently by employing an apodized input transducer 54 for the channel 3 path, a uniform input transducer 72 for the channel 4 path, a uniform output transducer 66 for the channel 3 path, and an apodized output transducer 80 for the channel 4 path. By arranging these components as shown relative to the multistrip couplers, the entire structure (plus open areas) covers a rectangular area no greater than 149 by 212 mils.

It can be seen, therefore, that the filters described above occupy relatively small substrates and yet avoid introducing multi-path distortion in their output signals by optimizing the performance of the multistrip couplers.

Although the invention has been described in terms of preferred filter architectures, it will be obvious to those skilled in the art that various alterations and modifications may be made without departing from the invention. Accordingly, it is intended that all such alterations and modifications be considered as within the spirit and scope of the invention as defined by the appended claims.

What is claimed is:

1. In an acoustic surface wave multiplexing filter having a substrate, first and second input transducers, first and second output transducers, and first and second multistrip couplers for coupling acoustic surface waves from the input transducers to the output transducers, an improved architecture for the filter characterized in that the first and second multistrip couplers are formed on the substrate in a position of side-by-side overlap with each other, with each multistrip coupler being disposed between one of the input transducers and one of the output transducers.

2. The improvement as set forth in claim 1 wherein the second input transducer and the first output transducer are situated on the substrate in substantially straight, horizontal alignment with each other and separated from each other by overlapping portions of the multistrip couplers.

3. The improvement as set forth in claim 1 wherein each multistrip coupler includes a lower track and an upper track and has a resonance frequency, and wherein each multistrip coupler is selected to suppress energy transmission between its tracks at frequencies around the second harmonic of its resonance frequency.

4. The improvement as set forth in claim 1 wherein said multistrip couplers each include a lower track and an upper track, and wherein each coupler is configured to maximize the transfer of energy between its tracks so as to reduce the transfer of energy from one coupler to the other coupler in their area of overlap.

5. The improvement as set forth in claim 4 wherein the first input transducer is an apodized transducer situated on one side of the first multistrip coupler and adjacent its lower track, and wherein the first output transducer is a uniform transducer situated on an opposite side of the first multistrip coupler and adjacent its upper track.

6. The improvement as set forth in claim 5 wherein the second input transducer is an apodized transducer situated on one side of the second multistrip coupler and adjacent its lower track, and wherein the second output transducer is a uniform transducer situated on an opposite side of the second multistrip coupler and adjacent its upper track.

7. The improvement as set forth in claim 6 wherein the first and second apodized input transducers are situated near one end of the substrate in a position of adjacent overlap with each other.

8. The improvement as set forth in claim 1 wherein the first input transducer is an apodized transducer and the second input transducer is a uniform transducer.

9. The improvement as set forth in claim 8 wherein the first output transducer is a uniform transducer and the second output transducer is an apodized transducer.

10. The improvement as set forth in claim 9 wherein said multistrip couplers each include a lower track and an upper track, wherein the first apodized input transducer is situated on one side of the first multistrip coupler and adjacent its lower track, and wherein the first uniform output transducer is situated on an opposite side of the first multistrip coupler and adjacent its upper track.

11. The improvement as set forth in claim 10 wherein the second uniform input transducer is situated on one side of the second multistrip coupler and adjacent its lower track, and wherein the second apodized output transducer is situated on an opposite side of the second multistrip coupler and adjacent its upper track.

12. An acoustic surface wave filter, comprising:
an apodized input transducer adapted to receive a first input signal;
a uniform input transducer adapted to receive a second input signal;
a first multistrip coupler having a lower track, an upper track and a resonance frequency, the lower track thereof being adjacent said apodized input transducer, said first multistrip coupler being configured to suppress energy transmission between its tracks at frequencies around the second harmonic of its resonance frequency and to otherwise maximize the transfer of energy between its tracks;
a second multistrip coupler having a lower track, an upper track and a resonance frequency, one side of the lower track being adjacent the uniform input transducer and the opposite side of the lower track being in a position of side-by-side overlap with the upper track of said first multistrip coupler, said second multistrip coupler being configured to suppress energy transmission between its tracks at frequencies around the second harmonic of its resonance frequency and to otherwise maximize the transfer of energy between its tracks;
a uniform output transducer situated adjacent the upper track of the first multistrip coupler in substantial horizontal alignment with the uniform input transducer and separated thereby by the area of overlap and said multistrip couplers; and
an apodized output transducer situated adjacent the upper track of the second multistrip coupler.

* * * * *